United States Patent
Choi

(10) Patent No.: US 8,325,551 B2
(45) Date of Patent: Dec. 4, 2012

(54) SEMICONDUCTOR MEMORY DEVICE USING INTERNAL HIGH POWER SUPPLY VOLTAGE IN SELF-REFRESH OPERATION MODE AND RELATED METHOD OF OPERATION

(75) Inventor: Jang Seok Choi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 216 days.

(21) Appl. No.: 12/958,663

(22) Filed: Dec. 2, 2010

(65) Prior Publication Data

US 2011/0194358 A1 Aug. 11, 2011

(30) Foreign Application Priority Data

Feb. 11, 2010 (KR) .................. 10-2010-0012905

(51) Int. Cl.
G11C 7/00 (2006.01)
(52) U.S. Cl. .................. 365/222; 365/230.03
(58) Field of Classification Search .................. 365/222, 365/230.03, 189.11
See application file for complete search history.

(56) References Cited

U.S. PATENT DOCUMENTS

| 6,590,822 B2 * | 7/2003 | Hwang et al. ........... 365/222 |
| 6,611,470 B2 * | 8/2003 | Hidaka ........... 365/222 |
| 7,164,615 B2 * | 1/2007 | Park et al. ........... 365/222 |
| 7,313,047 B2 * | 12/2007 | Kim ........... 365/222 |

FOREIGN PATENT DOCUMENTS

| JP | 11203861 A | 7/1999 |
| KR | 1020030026035 A | 3/2003 |
| KR | 1020060091726 A | 8/2006 |

* cited by examiner

Primary Examiner — Son Dinh
(74) Attorney, Agent, or Firm — Volentine & Whitt, PLLC

(57) ABSTRACT

A semiconductor memory device comprises a memory cell array comprising a plurality of memory banks. The semiconductor memory device performs refresh operations on the memory cell array using a normal refresh operation mode and a self-refresh operation mode. In the normal refresh operation mode, the semiconductor memory device performs refresh operations using an external high power supply voltage, and in the self-refresh operation mode, the semiconductor memory device performs refresh operations using an internal high power supply voltage. In the self-refresh operation mode, the refresh operations are performed in units of memory banks or memory bank groups.

20 Claims, 4 Drawing Sheets

US 8,325,551 B2

SEMICONDUCTOR MEMORY DEVICE USING INTERNAL HIGH POWER SUPPLY VOLTAGE IN SELF-REFRESH OPERATION MODE AND RELATED METHOD OF OPERATION

CROSS-REFERENCE TO RELATED APPLICATIONS

This application claims priority under 35 U.S.C. §119 to Korean Patent Application No. 10-2010-0012905 filed on Feb. 11, 2010, the disclosure of which is hereby incorporated by reference in its entirety.

BACKGROUND

Embodiments of the inventive concept relate generally to semiconductor memory devices. More particularly, embodiments of the inventive concept relate to semiconductor memory devices using an internal high power supply voltage in a specific operation mode, such as a self-refresh operation mode.

Dynamic random access memory (DRAM) is used in a wide variety of technical applications, ranging from satellite technologies to consumer electronics. Moreover, during the past several decades, there has been a continual demand for increasingly high capacity, high performance, and low power DRAM devices.

As DRAM devices have improved in their storage capacity, performance, and power consumption, their operating voltages have tended to decrease accordingly. In other words, the operating voltages for newer DRAM devices tend to be lower compared with older DRAM devices. As examples, low power (LP) double data rate 2 (DDR2) and double data rate 4 (DDR4) DRAM devices use an operation power supply voltage VDD of about 1.2V and a high power supply voltage VPP of about 1.8V or 2.5V.

In certain conventional DRAM devices, a high power supply voltage VPP is generated by self-boosting of an operation power supply voltage VDD within the DRAM devices. However, a voltage regulator can become overloaded if a high power supply voltage VPP of about 1.8V or 2.5V is generated from an operation power supply voltage VDD of about 1.2V through self-boosting. As a result, in LP DDR2 and DDR4 DRAM devices, the high power supply voltage of about 1.8V or 2.5V is received from an external source.

In a data processing system providing an external high power supply voltage EVPP to a DRAM, the external high power supply voltage EVPP is typically used to power other components in addition to the DRAM. Accordingly, to enter into a low power sleep mode, the data processing system typically cuts off the high power supply voltage EVPP to reduce power consumption by all of the components. But even in the sleep mode, the DRAM requires power to perform a refresh operation to retain stored data. Consequently, the DRAM device must be able to receive power from an alternative source to compensate for the loss of EVPP during the sleep mode of the data processing system.

SUMMARY

Embodiments of the inventive concept provide semiconductor memory devices capable of performing operations using an internal high power supply voltage during loss of an external high power supply voltage. In some embodiments, the semiconductor memory devices use the internal high power supply voltage to perform operations according to a specific operation mode such as a self-refresh operation mode. In some embodiments, the internal high power supply voltage is used in a self-refresh operation of a DRAM within a data processing system without decreasing a pump efficiency of the DRAM. In addition, in some embodiments, the DRAM improves the sleep mode performance of the data processing system.

According to one embodiment of the inventive concept, a method is provided for applying a high power supply voltage to a semiconductor memory device comprising a memory cell array comprising a plurality of memory banks. The method comprises applying a first power supply voltage to the memory cell array as the high power supply voltage for a first time period in a first operation mode of the semiconductor memory device, and applying a second power supply voltage to a subset of the memory banks for a second time period in a second operation mode of the semiconductor memory device. The second time period is shorter than the first time period, and wherein the second power supply voltage is provided to the semiconductor memory device through a different pathway than the first power supply voltage.

In certain embodiments, the first operation mode is a normal operation mode and the second operation mode is a self-refresh operation mode.

In certain embodiments, the first operation mode is an auto-refresh operation mode and the second operation mode is a self-refresh operation mode.

In certain embodiments, the first power supply voltage is an external high power supply voltage and the second power supply voltage is an internal high power supply voltage.

In certain embodiments, the first power supply voltage is a high power supply voltage provided from a source external to the semiconductor memory device, and the second power supply voltage is an internal high power supply voltage generated by pumping an internal power supply voltage of the semiconductor memory device.

In certain embodiments, the second time period has a duration that is smaller than a duration of the first time period by an amount proportional to the number of the memory banks.

According to another embodiment of the inventive concept, a semiconductor memory device comprises a memory cell array comprising a plurality of memory banks or memory bank groups, a switching unit configured to select between first and second different power supply voltages in response to an operation mode detection signal, and a mode detection and refresh control unit that generates the operation mode detection signal upon detection of a first operation mode or a second operation mode determined according to a refresh operation being performed, causes the switching unit to apply the first power supply voltage to the memory cell array for a first time period in the first operation mode, and causes the switching unit to apply the second power supply voltage to a subset of the plurality of memory banks or memory bank groups for a second time period shorter than the first time period in the second operation mode.

In certain embodiments, the first operation mode is a normal operation mode and the second operation mode is a self-refresh operation mode.

In certain embodiments, the first power supply voltage is an external high power supply voltage and the second power supply voltage is an internal high power supply voltage.

In certain embodiments, the second time period corresponds to a time period obtained by dividing the first time period by the number of the memory banks.

In certain embodiments, the first power supply voltage is a high power supply voltage received from a device external to the semiconductor memory device, and the second power supply voltage is an internal high power supply voltage generated by pumping an internal power supply voltage of the semiconductor memory device.

In certain embodiments, the mode detection and refresh control unit comprises a command buffer configured to temporarily store applied command signals, a command decoder configured to receive and decode an output of the command buffer, an applied bank address, and a bank control signal, and to output the operation mode detection signal and first and second control signals, a refresh timer configured to selectively generate a refresh operation time pulse in response to the first control signal, a switch configured to select the second control signal in response to the operation mode detection signal and to output the second control signal as a multiplexing selection signal, a multiplexer configured to apply the refresh operation time pulse in units of memory banks or memory bank groups in response to the multiplexing selection signal, and a refresh address counter unit configured to output counted refresh addresses that correspond to the respective memory banks or memory bank groups.

In certain embodiments, the operation mode detection signal is activated during a self-refresh operation.

In certain embodiments, in the self-refresh operation, a duration of the refresh time period of the refresh timer is determined by adding a predetermined margin to a product of the second time period and the number of memory banks or memory bank groups in the memory cell array.

According to another embodiment of the inventive concept, a method is provided for controlling a high power supply voltage to operate a data processing system comprising a semiconductor memory device comprising a memory cell array comprising a plurality of memory bank groups. The method comprises applying a first power supply voltage to the memory cell array as the high power supply voltage in a normal operation mode of the semiconductor memory device, and applying a second power supply voltage different from the first power supply voltage to one of the memory bank groups in a self-refresh operation mode of the semiconductor memory device. The second power supply voltage is applied to the subset of the memory bank groups for a time period having a duration obtained by dividing a duration of a self-refresh period by the number of memory bank groups.

In certain embodiments, the normal operation mode comprises an active operation mode and an auto-refresh operation mode.

In certain embodiments, the first power supply voltage is an external high power supply voltage and the second power supply voltage is an internal high power supply voltage.

In certain embodiments, the external high power supply voltage and the internal high power supply voltage are high power supply voltages used in a DDR4 DRAM.

In certain embodiments, the external high power supply voltage and the internal power supply voltage are high power supply voltages used in an LP DDR2 DRAM.

In certain embodiments, the self-refresh operation mode of the semiconductor memory device occurs during a sleep mode of the data processing system.

BRIEF DESCRIPTION OF THE DRAWINGS

The drawings illustrate selected embodiments of the inventive concept. In the drawings, like reference numbers indicate like features.

DETAILED DESCRIPTION OF THE EMBODIMENTS

Embodiments of the inventive concept are described below with reference to the accompanying drawings. These embodiments are presented as teaching examples and should not be construed to limit the scope of the inventive concept.

In the description that follows, where a feature is referred to as being connected to another feature, the features may be connected directly, or intervening elements may be present. In addition, the drawings provide simplified illustrations of various features in order to clearly explain certain embodiments of the inventive concept. However, other features, such as additional circuit blocks, can be added without departing from the scope of the inventive concept.

Figure 1:
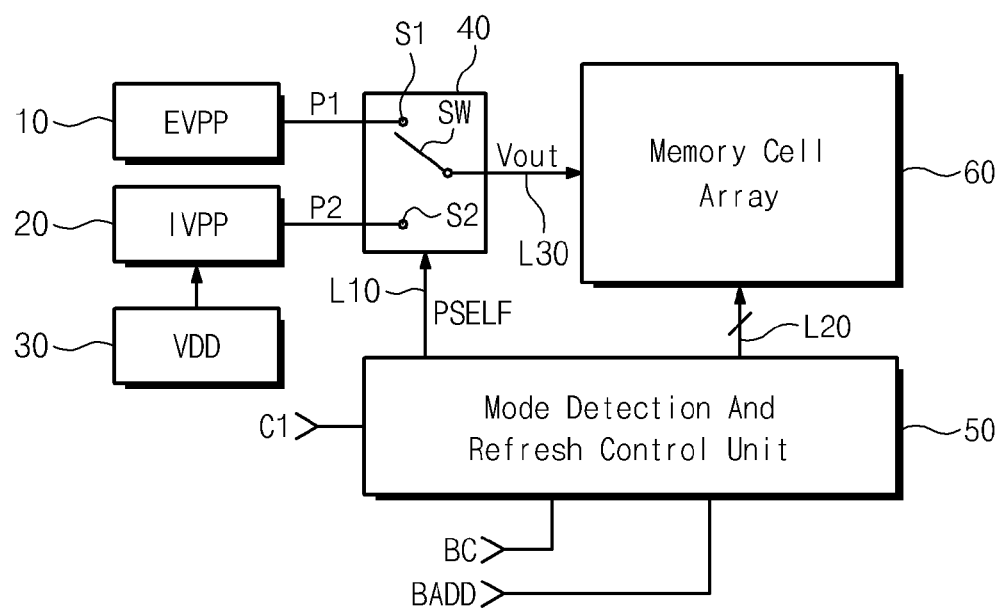
FIG. 1 is a block diagram of a semiconductor memory device according to an embodiment of the inventive concept.

FIG. 1 is a block diagram illustrating a semiconductor memory device according to an embodiment of the inventive concept.

Referring to FIG. 1, the semiconductor memory device comprises an external high power supply voltage input unit 10, an internal high power supply voltage generation unit 20, an internal operation power supply voltage generation unit 30, a switching unit 40, a mode detection and refresh control unit 50, and a memory cell array 60.

Memory cell array 60 comprises a plurality of memory banks, where each memory bank comprises a plurality of memory cells, and each memory cell comprises an access transistor and a storage capacitor. In certain embodiments, the memory banks are organized in memory bank groups, each comprising a plurality of the memory banks.

Memory cell array 60 receives a high power supply voltage Vout for a refresh operation through a power supply line L30, and receives a refresh address through a line L20.

Switching unit 40 receives an operation mode detection signal PSELF through a line L10 and selectively switches on first and second power supply voltages EVPP and IVPP in response to operation mode detection signal PSELF.

External high power supply voltage input unit 10 receives first power supply voltage EVPP from an external source and supplies first power supply voltage EVPP to an output path P1. Internal high power supply voltage generation unit 20 generates second power supply voltage IVPP by self-boosting an internal operation power supply voltage VDD and supplies second power supply voltage IVPP to an output path P2. Internal operation power supply voltage generation unit 30 generates a stable internal operation power supply voltage VDD by comparing an input operation power supply voltage with a reference power supply voltage.

Mode detection and refresh control unit 50 receives command signals C1, a bank control signal BC, and a bank address BADD. Based on the received signals, mode detection and refresh control unit 50 detects a first or second operation mode of the semiconductor memory device and generates operation mode detection signal PSELF according to the detected operation mode.

The first operation mode is a normal operation mode of the semiconductor memory device, and the second operation mode is a self-refresh operation mode of the semiconductor memory device. In the first operation mode, mode detection and refresh control unit 50 causes switching unit 40 to apply first power supply voltage EVPP to memory cell array 60 for a first time period. In the second operation mode, mode detection and refresh control unit 50 causes switching unit 40 to apply second power supply voltage IVPP to at least one of the plurality of memory banks for a second time period, which is shorter than the first time period. The second time period is obtained by dividing the first time period by a number of the memory banks in memory cell array 60.

In the normal operation mode, the semiconductor memory device performs active operations and auto-refresh operations. Where the semiconductor memory device enters into the self-refresh operation mode, mode detection and refresh control unit 50 activates operation mode detection signal PSELF.

In response to the activation of operation mode detection signal PSELF, a switch SW of switching unit 40 is switched to a selection end S2, and second power supply voltage IVPP is applied to memory cell array 60 as a supply voltage Vout through power supply line L30.

In the self-refresh operation mode, second power supply voltage IVPP is applied to different memory banks of memory cell array 60 so that a refresh load is distributed. In some embodiments, second power supply voltage IVPP is applied in units of memory banks or memory bank groups. Where second power supply voltage IVPP is applied in units of memory banks or memory bank groups of memory cell array 60, a decrease in the charge pump efficiency of internal high power supply voltage generation unit 20 is prevented. Consequently, the self-refresh operation may be performed with a reduced error rate.

Figure 2:
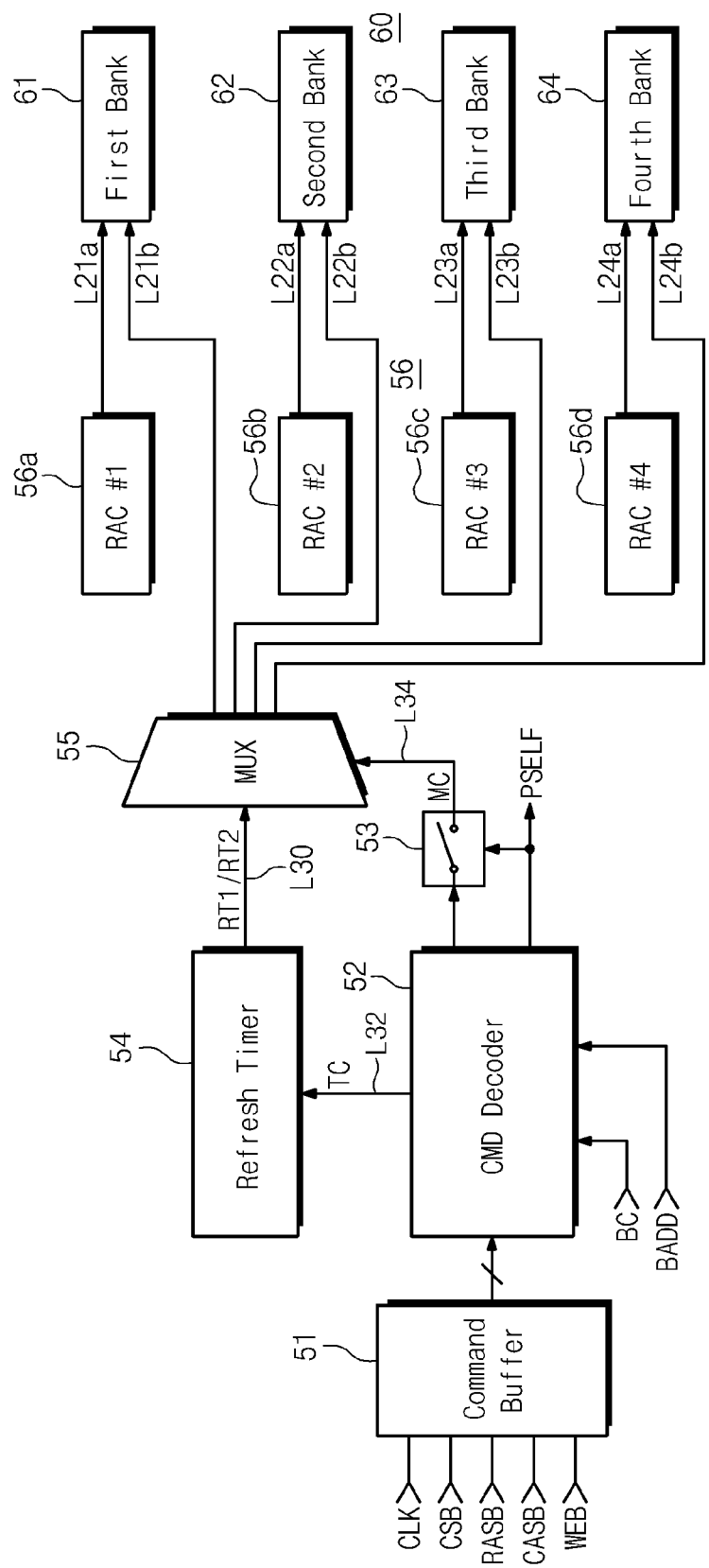
FIG. 2 is a block diagram illustrating an example of a mode detection and refresh control unit of the semiconductor memory device of FIG. 1.

FIG. 2 is a block diagram showing an example configuration of mode detection and refresh control unit 50 of FIG. 1.

Referring to FIG. 2, mode detection and refresh control unit 50 comprises a command buffer 51, a command decoder 52, a switch 53, a refresh timer 54, a multiplexer 55, and a refresh address counter unit 56.

Command buffer 51 buffers and outputs command signals CLK, CSB, RASB, CASB, and WEB applied thereto. Here, CLK indicates a clock signal, CSB indicates a chip select signal for selecting a chip, RASB indicates a row address strobe signal, CASB indicates a column address strobe signal, and WEB indicates a write enable signal functioning as a flag for reading and writing operations. Generally, an active command signal and an auto-refresh command signal are actuated in response to different combinations of the CSB, RASB, CASB, and WEB signals. Also, operation mode detection signal PSELF indicating entry into the self-refresh operation is activated in response to a combination of the auto-refresh command signal and a clock enable signal CKE.

Command decoder 52 receives and decodes an output of command buffer 51, bank address BADD, and bank control signal BC. In response to these decoded signals, command decoder 52 outputs operation mode detection signal PSELF and first and second control signals TC and MC.

Refresh timer 54 selectively generates a refresh operation time pulse RT1 or RT2 in response to first control signal TC. In the self-refresh operation mode, refresh timer 54 generates a self-refresh operation time pulse RT2. In the normal operation mode, refresh timer 54 generates a normal operation time pulse RT1. Self-refresh operation time pulse RT2 has a logic level "high" during each of intervals T10, T11, T12, and T13 shown in a waveform 3C of FIG. 3, and normal operation time pulse RT1 has the logic level "high" during intervals that are twice as long as interval T10, as shown in a waveform 3B of FIG. 3.

Switch 53 switches on second control signal MC in response to operation mode detection signal PSELF and outputs the second control signal MC as a multiplexing selection signal.

In response to the multiplexing selection signal MC, multiplexer 55 applies self-refresh operation time pulse RT2 to units of banks or bank groups.

For example, where memory cell array 60 comprises four memory banks 61, 62, 63, and 64, four refresh address counters 56a, 56b, 56c, and 56d of refresh address counter unit 56 output respective counted refresh addresses to corresponding banks or bank groups through lines L21a, L22a, L23a, and L24a.

Figure 3:
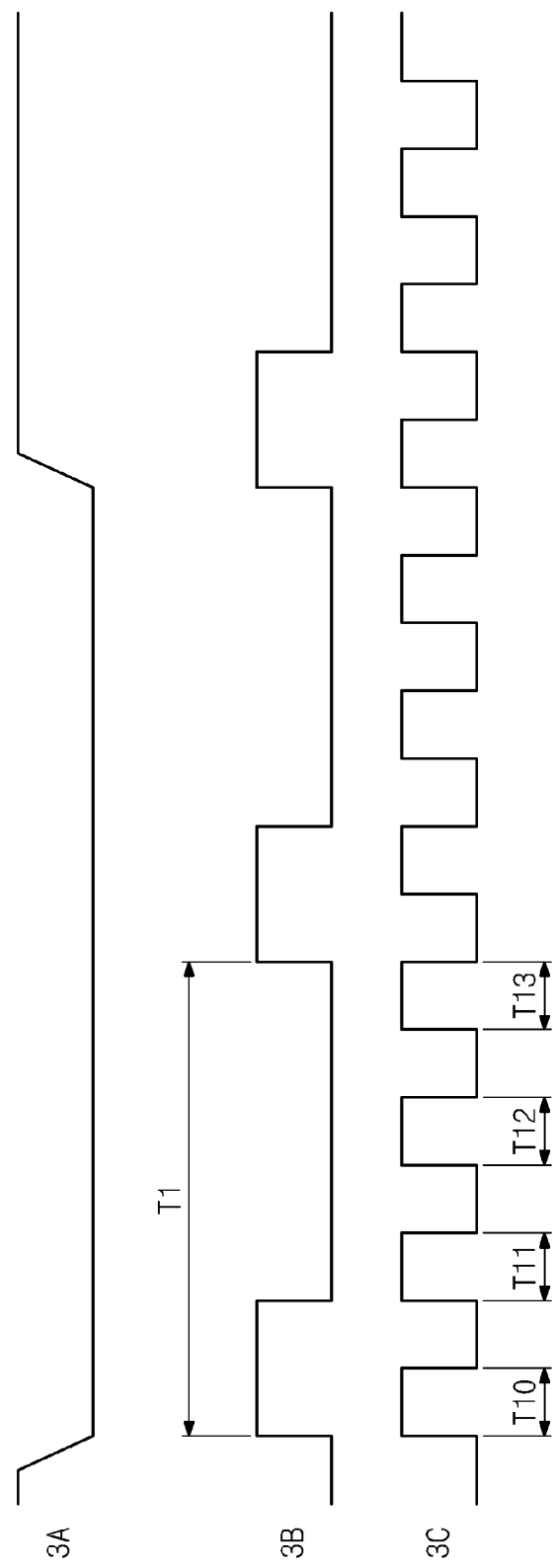
FIG. 3 is a timing diagram illustrating the operation of the mode detection and refresh control unit of FIG. 2.

FIG. 3 is timing diagram illustrating the operation of mode detection and refresh control unit 50 shown in FIG. 2.

In FIG. 3, a waveform 3A indicates the timing of clock enable signal CKE, a waveform 3B indicates the timing for applying an external high power supply voltage to memory banks in a normal refresh operation, and a waveform 3C indicates the timing for applying an internal high power supply voltage to memory banks in a self-refresh operation.

Referring to FIGS. 2 and 3, as multiplexing selection signal MC is applied to multiplexer 55 through line L34, a high pulse appears at a first output end L21b of multiplexer 55 during period T10 of waveform 3C to provide internal high power supply voltage IVPP to first memory bank 61 for a self-refresh operation. Next, a high pulse appears at a second output end L22b of multiplexer 55 during period T11 of waveform 3C to provide internal high power supply voltage IVPP to second memory bank 62 for a self-refresh operation. Thereafter, a high pulse appears at a third output end L23b of multiplexer 55 during period T12 of waveform 3C to provide internal high power supply voltage IVPP to third memory bank 63 for a self-refresh operation. Finally, a high pulse appears at a fourth output end L24b of multiplexer 55 during period T13 of waveform 3C to provide internal high power supply voltage IVPP to fourth memory bank 64 for a self-refresh operation.

In FIG. 3, waveform 3B comprises a time interval T1 in which a pulse has logic level "high" for a first time period. The first time period is longer than a second time period corresponding to interval T10.

The overall refresh time period of refresh timer 54 of FIG. 2 is obtained by multiplying the second time period (time period T10) by the number of banks or bank groups and then adding a predetermined margin. For example, where the overall refresh time period is referred to as tREFI, the second time period is referred to as tREFU, and the predetermined margin is referred to as REFMAR, a relationship can be expressed as "tREFI=tREFU×number of banks or bank groups+REFMAR."

Figure 4:
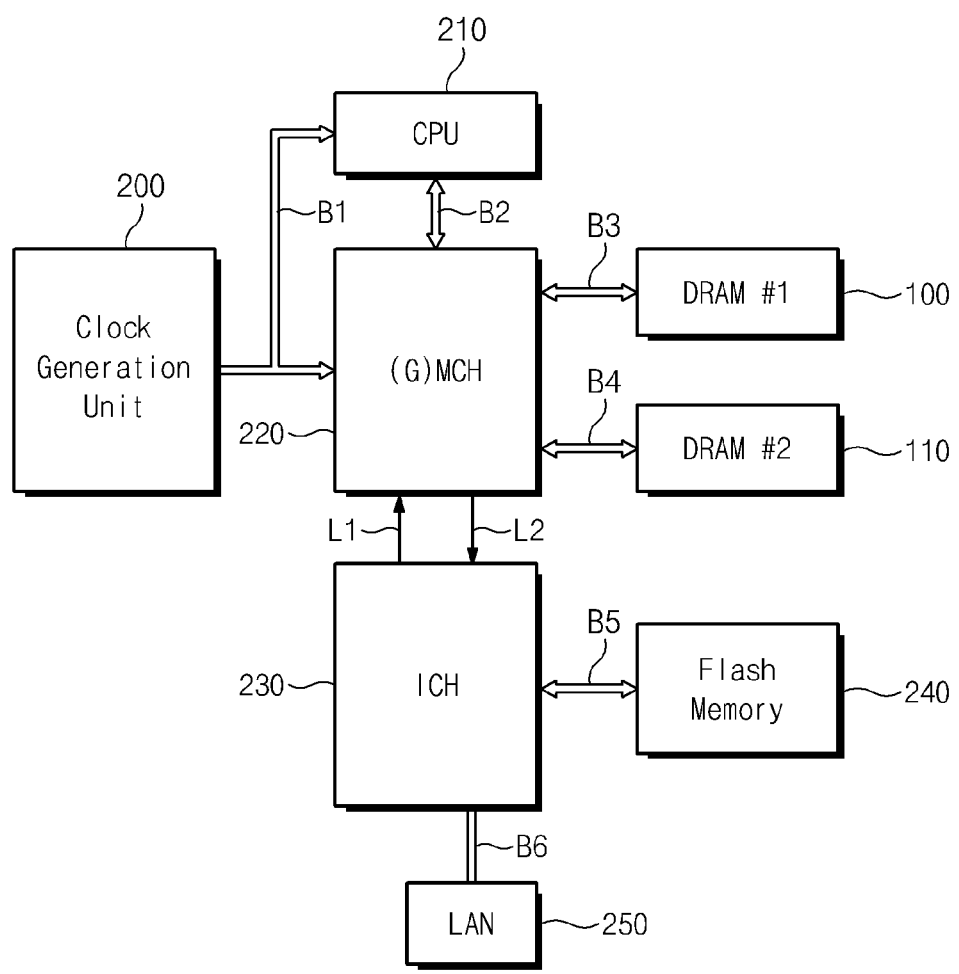
FIG. 4 is a block diagram illustrating a data processing system comprising the semiconductor memory device of FIG. 1.

FIG. 4 is a block diagram of a data processing system comprising the semiconductor memory device of FIG. 1. In certain embodiments, the data processing system comprises a mobile device.

Referring to FIG. 4, the data processing system comprises a first DRAM 100, a second DRAM 110, a clock generation unit 200, a central processing unit (CPU) 210, a memory control hub (MCH) 220, an input/output control hub (I/O ICH) 230, a local area network (LAN) card 250, and a flash memory 240. For explanation purposes, it will be assumed that first DRAM 100 and second DRAM 110 each incorporate a semiconductor memory device such as that described with reference to FIG. 1.

Clock generation unit 200 generates clock signals for operating the data processing system. CPU 210 is connected to clock generation unit 200 through a bus line B1 to control the overall operations of the data processing system according to predetermined programs. MCH 220 is connected to CPU 210 through a bus line B2 to control a memory. I/O ICH 230 controls an I/O device. LAN card 250 is connected to I/O ICH 230 through a bus line B6. First DRAM 100 and a second DRAM 110 are connected to MCH 220 through respective bus lines B3 and B4. Flash memory is connected to I/O ICH 230 through a bus line B5.

Where the data processing system enters sleep mode, it may be difficult to apply an external high power supply voltage EVPP to first DRAM 100 or second DRAM 110 due to a power saving operation.

Accordingly, switch SW of switching unit 40 in first DRAM 100 or second DRAM 110 is switched to selection end S2 so that the self-refresh operation is efficiently performed by internal high power supply voltage IVPP. Where first DRAM 100 or second DRAM 110 enters the self-refresh operation mode, mode detection and refresh control unit 50 activates operation mode detection signal PSELF.

Where operation mode detection signal PSELF is activated, internal high power supply voltage IVPP is generated as the supply voltage Vout and applied to memory cell array 60 according to the operation of switching unit 40. Internal high power supply voltage IVPP is generated with timing shown by waveform 3C of FIG. 3 by controlling multiplexer 55.

As described above, internal high power supply voltage IVPP is not applied to all the banks of memory cell array 60 simultaneously, but is applied in units of memory banks or memory bank groups so that the refresh load is distributed. Where internal high power supply voltage IVPP is thus applied in units of memory banks or memory bank groups, a decrease in the charge pump efficiency of internal high power supply voltage generation unit 20 is prevented. As a result, the self-refresh operation can be performed with a reduced error rate.

The semiconductor device of FIG. 1 exits from the self-refresh operation mode within a predetermined time after receiving an exit command, and allows the self-refresh operation to be completed on all memory banks or memory bank groups in the same row prior to exiting. In other words, the self-refresh operation is performed with respect to all the banks or bank groups of the same row while the predetermined time passes after clock enable signal CKE having waveform 3A transitions from low to high. Here, the predetermined time for completing the self-refresh operation of the same row can be set to 10 ns or less.

As indicated by the foregoing, certain embodiments of the inventive concept use an internal high power supply voltage to perform various operations in a semiconductor memory device during a self-refresh operation mode. In other embodiments, different operations can be performed using the internal high power supply voltage, including operations in other modes of the semiconductor memory device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method for applying a high power supply voltage to a semiconductor memory device comprising a memory cell array comprising a plurality of memory banks, the method comprising:
   applying a first power supply voltage to the memory cell array as the high power supply voltage for a first time period in a first operation mode of the semiconductor memory device; and
   applying a second power supply voltage to a subset of the memory banks for a second time period in a second operation mode of the semiconductor memory device, wherein the second time period is shorter than the first time period, and wherein the second power supply voltage is provided to the semiconductor memory device through a different pathway than the first power supply voltage.

2. The method of claim 1, wherein the first operation mode is a normal operation mode and the second operation mode is a self-refresh operation mode.

3. The method of claim 1, wherein the first operation mode is an auto-refresh operation mode and the second operation mode is a self-refresh operation mode.

4. The method of claim 2, wherein the first power supply voltage is an external high power supply voltage and the second power supply voltage is an internal high power supply voltage.

5. The method of claim 2, wherein the first power supply voltage is a high power supply voltage provided from a source external to the semiconductor memory device, and the second power supply voltage is an internal high power supply voltage generated by pumping an internal power supply voltage of the semiconductor memory device.

6. The method of claim 2, wherein the second time period has a duration that is smaller than a duration of the first time period by an amount proportional to the number of the memory banks.

7. A semiconductor memory device, comprising:
   a memory cell array comprising a plurality of memory banks or memory bank groups;
   a switching unit configured to select between first and second different power supply voltages in response to an operation mode detection signal; and
   a mode detection and refresh control unit that generates the operation mode detection signal upon detection of a first operation mode or a second operation mode determined according to a refresh operation being performed, causes the switching unit to apply the first power supply voltage to the memory cell array for a first time period in the first operation mode, and causes the switching unit to apply the second power supply voltage to a subset of the plurality of memory banks or memory bank groups for a second time period shorter than the first time period in the second operation mode.

8. The semiconductor memory device of claim 7, wherein the first operation mode is a normal operation mode and the second operation mode is a self-refresh operation mode.

9. The semiconductor memory device of claim 7, wherein the first power supply voltage is an external high power supply voltage and the second power supply voltage is an internal high power supply voltage.

10. The semiconductor memory device of claim 7, wherein the second time period corresponds to a time period obtained by dividing the first time period by the number of the memory banks.

11. The semiconductor memory device of claim 7, wherein the first power supply voltage is a high power supply voltage received from a device external to the semiconductor memory device, and the second power supply voltage is an internal high power supply voltage generated by pumping an internal power supply voltage of the semiconductor memory device.

12. The semiconductor memory device of claim 7, wherein the mode detection and refresh control unit comprises:
   a command buffer configured to temporarily store applied command signals;
   a command decoder configured to receive and decode an output of the command buffer, an applied bank address, and a bank control signal, and to output the operation mode detection signal and first and second control signals;
   a refresh timer configured to selectively generate a refresh operation time pulse in response to the first control signal;
   a switch configured to select the second control signal in response to the operation mode detection signal and to output the second control signal as a multiplexing selection signal;
   a multiplexer configured to apply the refresh operation time pulse in units of memory banks or memory bank groups in response to the multiplexing selection signal; and
   a refresh address counter unit configured to output counted refresh addresses that correspond to the respective memory banks or memory bank groups.

13. The semiconductor memory device of claim 12, wherein the operation mode detection signal is activated during a self-refresh operation.

14. The semiconductor memory device of claim 13, wherein, in the self-refresh operation, a duration of the refresh time period of the refresh timer is determined by adding a predetermined margin to a product of the second time period and the number of memory banks or memory bank groups in the memory cell array.

15. A method of controlling a high power supply voltage to operate a data processing system comprising a semiconductor memory device comprising a memory cell array comprising a plurality of memory bank groups, the method comprising:
   applying a first power supply voltage to the memory cell array as the high power supply voltage in a normal operation mode of the semiconductor memory device; and
   applying a second power supply voltage different from the first power supply voltage to one of the memory bank groups in a self-refresh operation mode of the semiconductor memory device;
   wherein the second power supply voltage is applied to the subset of the memory bank groups for a time period having a duration obtained by dividing a duration of a self-refresh period by the number of memory bank groups.

16. The method of claim 15, wherein the normal operation mode comprises an active operation mode and an auto-refresh operation mode.

17. The method of claim 16, wherein the first power supply voltage is an external high power supply voltage and the second power supply voltage is an internal high power supply voltage.

18. The method of claim 17, wherein the external high power supply voltage and the internal high power supply voltage are high power supply voltages used in a double data rate 4 (DDR4) dynamic random access memory (DRAM).

19. The method of claim 17, wherein the external high power supply voltage and the internal power supply voltage are high power supply voltages used in a low power (LP) double data rate 2 (DDR2) dynamic random access memory (DRAM).

20. The method of claim 18, wherein the self-refresh operation mode of the semiconductor memory device occurs during a sleep mode of the data processing system.

* * * * *